(12) United States Patent
Ju et al.

(10) Patent No.: US 10,903,469 B2
(45) Date of Patent: Jan. 26, 2021

(54) INTERCONNECTING MEMBER OCCUPYING LESS SPACE IN BATTERY MODULE AND BATTERY MODULE COMPRISING SAME

(71) Applicant: LG CHEM, LTD., Seoul (KR)

(72) Inventors: Jae Hyeon Ju, Daejeon (KR); Jin Hong Park, Daejeon (KR); Sang Hyuk Ma, Daejeon (KR); Hyung Jun Ahn, Daejeon (KR); Bo Hyon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 123 days.

(21) Appl. No.: 16/067,395

(22) PCT Filed: Aug. 22, 2017

(86) PCT No.: PCT/KR2017/009169
§ 371 (c)(1),
(2) Date: Jun. 29, 2018

(87) PCT Pub. No.: WO2018/038513
PCT Pub. Date: Mar. 1, 2018

(65) Prior Publication Data
US 2019/0020012 A1 Jan. 17, 2019

(30) Foreign Application Priority Data
Aug. 24, 2016 (KR) .................... 10-2016-0107886

(51) Int. Cl.
*H01M 2/20* (2006.01)
*H01M 2/26* (2006.01)
(Continued)

(52) U.S. Cl.
CPC ............ *H01M 2/206* (2013.01); *G01R 31/36* (2013.01); *H01M 2/26* (2013.01);
(Continued)

(58) Field of Classification Search
CPC .. H01M 2/206–26; H01M 10/413–425; H01R 12/59
See application file for complete search history.

(56) References Cited

U.S. PATENT DOCUMENTS

| 6,225,778 B1 | 5/2001 | Hayama et al. |
| 2011/0091763 A1 | 4/2011 | Park et al. |
| (Continued) | | |

FOREIGN PATENT DOCUMENTS

| CN | 102735367 A | 10/2012 |
| CN | 103270651 A | 8/2013 |
| (Continued) | | |

OTHER PUBLICATIONS

Extended European Search Report, dated Dec. 14, 2018, for European Application No. 17843933.7.
(Continued)

*Primary Examiner* — Osei K Amponsah
(74) *Attorney, Agent, or Firm* — Birch, Stewart, Kolasch & Birch, LLP

(57) ABSTRACT

Provided is an interconnection member including: (a) a main cable made of a flexible flat cable (FFC) including a plurality of copper wires; (b) a plurality of terminal parts branched from the main cable and electrically connected to at least one of the copper wires of the main cable, the plurality of terminal parts being connected to the bus bars to sense voltages of the battery cells; (c) a connecting part formed on one-side end of the main cable, and electrically and mechanically connected to the PCB; and (d) at least one temperature sensing part branched from the main cable, adjacent to the connecting part, while sharing at least one of the copper wires of the main cable.

15 Claims, 4 Drawing Sheets

(51) Int. Cl.

| | |
|---|---|
| *H01M 10/04* | (2006.01) |
| *H01M 10/42* | (2006.01) |
| *H01R 12/59* | (2011.01) |
| *H01R 9/22* | (2006.01) |
| *G01R 31/36* | (2020.01) |
| *H01R 11/28* | (2006.01) |
| *H01M 10/48* | (2006.01) |

(52) U.S. Cl.
CPC ..... *H01M 10/0413* (2013.01); *H01M 10/425* (2013.01); *H01M 10/482* (2013.01); *H01M 10/486* (2013.01); *H01R 9/22* (2013.01); *H01R 11/28* (2013.01); *H01R 12/59* (2013.01)

(56) References Cited

U.S. PATENT DOCUMENTS

| | | |
|---|---|---|
| 2013/0302651 A1 | 11/2013 | Kim et al. |
| 2014/0023897 A1 | 1/2014 | Suga |
| 2014/0370343 A1 | 12/2014 | Nomoto et al. |
| 2015/0063423 A1* | 3/2015 | Hua ............... G01K 7/223 374/185 |
| 2016/0126601 A1* | 5/2016 | Ichikawa ........... H02J 7/0091 374/152 |
| 2016/0133908 A1 | 5/2016 | Zhao |

FOREIGN PATENT DOCUMENTS

| | | |
|---|---|---|
| CN | 203675442 U | 6/2014 |
| CN | 204216124 U | 3/2015 |
| CN | 204788709 U | 11/2015 |
| CN | 105571740 A | 5/2016 |
| EP | 2842797 A1 | 3/2015 |
| JP | 54-5781 U | 6/1977 |
| JP | 7-115219 A | 5/1995 |
| JP | 2001-229741 A | 8/2001 |
| JP | 2001-250520 A | 9/2001 |
| JP | 2002-42903 A | 2/2002 |
| JP | 2009-238728 A | 10/2009 |
| JP | 2014-527270 A | 10/2014 |
| JP | 2015-118731 A | 6/2015 |
| KR | 10-2009-0095949 A | 9/2009 |
| KR | 10-2013-0125334 A | 11/2013 |
| WO | WO 2015/197319 A1 | 12/2015 |

OTHER PUBLICATIONS

International Search Report (PCT/ISA/210) issued in PCT/KR2017/009169, dated Nov. 28, 2017.

* cited by examiner

INTERCONNECTING MEMBER OCCUPYING LESS SPACE IN BATTERY MODULE AND BATTERY MODULE COMPRISING SAME

TECHNICAL FIELD

The present disclosure relates to an interconnection member occupying a small space in a battery module, and a battery module including the same.

BACKGROUND ART

Recently, secondary batteries that are chargeable and dischargeable are being widely used as energy sources for wireless mobile devices. Also, the secondary batteries have attracted considerable attention as power sources for electric vehicles (EVs), hybrid electric vehicles (HEVs), and plug-in hybrid electric vehicles (Plug-In HEVs), which have been proposed as solutions to air pollution and the like caused by existing gasoline and diesel vehicles that use fossil fuels.

Small sized mobile devices use one or a couple of battery cells for each device. On the other hand, medium and large sized devices such as vehicles use a battery pack in which a plurality of battery cells are electrically connected to each other, due to requirement for high power and large capacity.

Since it is preferable to manufacture the battery module as small and lightweight as possible, prismatic and pouch type batteries, which are capable of being charged at a high degree of integration and are relatively lightweight compared to their capacities, are being mainly used as battery cells for the medium and large sized battery module. Particularly, much interest is recently focused on the pouch type batteries, which use an aluminum laminate sheet as an exterior member, because of their characteristics such as light weight and low manufacturing costs.

In addition, the battery module has a configuration in which a plurality of cells are combined, so since overvoltage, overcurrent, or overheating occurring in some of the battery cells may adversely affect safety and operation efficiency of the battery module, there is a need for units which detect and control the overvoltage, overcurrent, or overheating.

Therefore, sensing members such as a temperature sensor and a voltage sensor are connected to the battery cells in conjunction with a printed circuit board to check and control the operation condition in real time or at regular time intervals. However, the installation or the connection of these sensing members makes the assembling process of the battery module too complicated, and causes a danger of short-circuit due to several wires for the sensing members.

In addition, as the application range of the secondary batteries is expanded, the secondary batteries are used as power sources for vehicles. Thus, fastening units are required to maintain a stable contact condition of the sensing members even when strong impact or vibration is applied thereto.

Aside from these units, a large number of members are generally required for the mechanical fastening and electrical contacting, for constituting the battery module by using a plurality of battery cells with the sensing members. However, this makes the assembling process of the battery cell too complicated, and increases the overall size of the battery cell.

Therefore, there is a great need for a sensing member capable of constituting a battery module with a more compact structure, and a battery module including the sensing member.

DISCLOSURE OF THE INVENTION

Technical Problem

The present disclosure provides solutions for the above-described limitations according to the related art and technical tasks requested from the past.

In particular, the present disclosure provides an interconnection member and a battery module including the interconnection member, wherein the interconnection member occupies a small space in the battery module because of its simple wiring structure, and is capable of sensing a temperature of the battery cell.

Technical Solution

In accordance with an exemplary embodiment, an interconnection member for connecting bus bars which are coupled to a printed circuit board (PCB) of a battery module and electrode terminals of battery cells, the interconnection member includes: (a) a main cable made of a flexible flat cable (FFC) including a plurality of copper wires; (b) a plurality of terminal parts branched from the main cable and electrically connected to at least one of the copper wires of the main cable, the plurality of terminal parts being connected to the bus bars to sense voltages of the battery cells; (c) a connecting part formed on one-side end of the main cable, and electrically and mechanically connected to the PCB; and (d) at least one temperature sensing part branched from the main cable, adjacent to the connecting part, while sharing at least one of the copper wires of the main cable, wherein at least two of (b) to (d) are made of an FFC.

That is, the interconnection member in accordance with the present disclosure includes connecting connectors for a voltage sensing part, the temperature sensing part, and the PCB, each of which has a wiring structure. The connecting connector is integrally formed with the main cable as a structure extending and branched from the main cable, so that the wiring structure becomes compact.

Particularly, the main cable is made of the FFC that is extremely thin and lightweight, and thus there is no need to prepare a separate space and a plurality of fastening members such as screws, bolts, rivets, and coupling arms, for installing the interconnection member. In one example, the interconnection member is fixed in such a manner that the main cable is attached to some surfaces of the battery cell or a module case by means of insulating tape, to thereby achieve excellent space utilization and deletion of components required for coupling.

In addition, the connecting part may be made of an FFC so as to be electrically and mechanically coupled to an FFC connector provided in the PCB. The connecting part may extend from the main cable while sharing all the copper wires of the main cable. This also, as described above, may achieve better space utilization of the interconnection member and significantly reduce the number of components required for installation.

As described above, the terminal parts and the temperature sensing parts branched from the main cable should be short-circuited to each other so that the terminal parts and the temperature sensing parts have independent current circuits respectively. Therefore, in the present disclosure, the copper wires respectively shared by the terminal parts and the terminal parts may be short-circuited to each other.

In a specific example, the temperature sensing part may includes: a first extending part extending from the main cable while sharing at least one copper wire of the main cable; and a ceramic thermistor disposed on an end of the first extending part while being electrically connected to the first extending part.

In this case, the first extending part may be made of an FFC, and the ceramic thermistor may be attached to an outer surface of the battery cell. This also, as described above, may achieve better space utilization of the interconnection member and significantly reduce the number of components required for installation.

In this configuration, a temperature may be sensed by detecting a change in current that flows from the ceramic thermistor to the PCB via the extending part, and the connecting part.

In one specific example, each of the terminal parts may include: a second extending part that extends from the main cable; and a contact part that is electrically connected to the second extending part and contacts a voltage sensing terminal provided in the bus bar.

As an exemplary embodiment, the second extending part may be an FFC that extends from the main cable while sharing at least one copper wire of the main cable.

The exemplary embodiment, as described above, may maximize the space utilization by using the FFC having the thin thickness and may be simply attached by means of the insulating tape. Therefore, the space utilization of the interconnection member for the battery module may be maximized.

In addition, because of flexibility of the FFC, a wiring structure may be designed to be a compact size. It is more preferable when electrode terminals, which are connected to the terminal parts, of the battery cells are positioned in one direction.

Alternatively, as another exemplary embodiment, the second extending part may be a wire coupled to at least one copper wire of the main cable by means of soldering.

In another exemplary embodiment as described above, the second extending part is made of a wire having high durability, and thus may be connected to the main cable while having a longer length. In other words, it is preferable in the case that the main cable is remote far from the battery cells due to a large size of the battery module. In addition, this wiring structure may be appropriate to the case that a wiring length becomes longer when the electrode terminals of the battery cells are disposed in several directions.

The contact part may have a ring shape so that the contact part is inserted and fastened to the voltage sensing terminal in a riveting manner. Through this riveting manner, a rivet of the voltage sensing terminal is fastened to the inside of the contact part to achieve mechanical and electrical coupling.

As another example, the contact part may be made of a plate-shaped plate so that the contact part is inserted and fastened to the voltage sensing terminal in a clamping manner.

The clamping manner may mean that voltage sensing terminals are pressed and deformed, in a state in which the contact part is disposed between the voltage sending terminals, to be mechanically fastened to the contact part.

In addition, the contact part may be made of a ring- or plate-shaped metal plate so that the contact part is coupled to the voltage sensing terminal by means of soldering or laser welding.

In another exemplary embodiment, a first clamping part may be coupled to the main cable in a clamping manner, as a configuration in which the second extending part is electrically connected to the copper wires of the main cable, and the contact part may include: branched wires which are branched from an end of the first clamping part; a second clamping part coupled to the branched wires in a clamping manner; and a plate-shaped plate contacting end which extends from the second clamping part and through which the contact part is coupled to the voltage sensing terminal by means of soldering or laser welding.

The clamping manner may mean that the first clamping part is physically pressed to accommodate the main cable therein, and this may be equally applied to the second clamping part and the branched wires.

The present disclosure also provides a battery module and a device including the battery module.

The battery module may include: a module laminated body in which at least two battery cells are laterally arranged; and a bus bar assembly that electrically connects electrode terminals of battery cells disposed on the front surface of the module laminated body.

In one specific example, the bus bar assembly may include: bus bars respectively coupled to the electrode terminals of the battery cells; and a main frame on which the bus bars are fixed and the PCB is mounted.

The interconnection member of the present disclosure may be fixed to the module laminated body in such a manner that the main cable is attached, along an outer surface of the module laminated body, by means of an insulating film or an adhesive.

That is, the main cable of the present disclosure is made of the FFC that is extremely thin and lightweight, and thus there is no need to prepare a separate space and a plurality of fastening members such as screws, bolts, rivets, and coupling arms, for installing the interconnection member. Therefore, a battery module with a more compact structure may be provided.

The device, for example, may include, but not limited to, laptop computers, netbooks, tablet personal computers, mobile phones, MP3 players, wearable electronic devices, power tools, electric vehicles (EVs), hybrid electric vehicles (HEVs), plug-in hybrid electric vehicles (PHEVs), electric bicycles (E-bikes), electric scooters (E-scooters), electric golf carts, or power storage systems.

Since structures and manufacturing methods of these devices are well known in the art, detail descriptions thereof will be omitted in this disclosure.

Advantageous Effects

As described above, an interconnection member of the present disclosure includes connecting connectors for a voltage sensing part, a temperature sensing part, and a PCB, each of which has a wiring structure. The connecting connector is integrally formed with a main cable as a structure extending and branched from the main cable, so that a wiring structure becomes compact.

Particularly, the main cable is made of the FTC that is extremely thin and lightweight, and thus there is no need to prepare a separate space and a plurality of fastening members such as screws, bolts, rivets, and coupling arms, for installing the interconnection member.

MODE FOR CARRYING OUT THE INVENTION

Hereinafter, although the present disclosure is described with reference to the drawings in accordance with exemplary embodiments, this is intended to provide a further comprehension of the present disclosure, and the scope of the present disclosure is not limited thereto.

Figure 1:
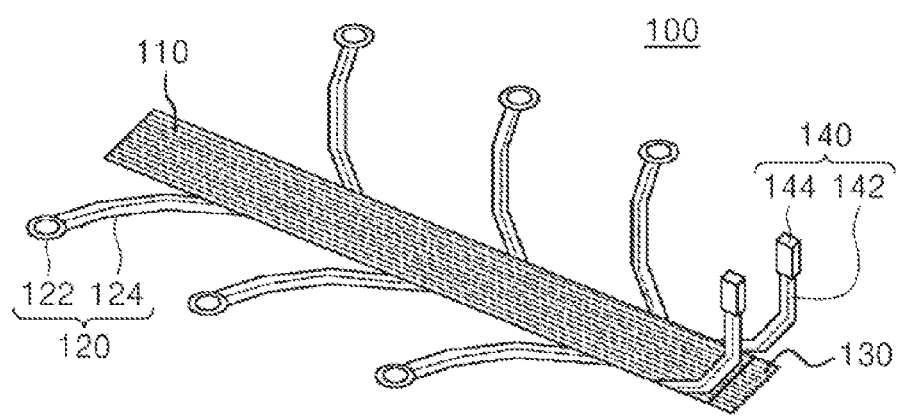
FIG. 1 is a schematic view of an interconnection member in accordance with an exemplary embodiment.

FIG. 1 illustrates a schematic view of an interconnection member in accordance with an exemplary embodiment.

Referring to FIG. 1, an interconnection member 100 includes a main cable 110 made of a flexible flat cable (FFC) having a plurality of copper wires, terminal parts 120, a connecting part 130 disposed on an end of the main cable 110, and a temperature sensing part 140.

Each of the terminal parts 120 includes a second extending part 124 that extends from the main cable 110, and a contact part 122 that is electrically connected to the second extending part 124 and contacts a voltage sensing terminal disposed in the bus bar.

The second extending parts 124 extends from one-side end of the main cable 110 while being spaced apart from each other at a predetermined distance, and also extends from the other end thereof while being spaced apart from each other at a predetermined distance, resulting in an approximately symmetrical configuration based on the main cable 110. This is merely one exemplary embodiment, so the second extending parts 124 may be asymmetrically arranged depending on an arrangement type of the battery cells.

Each of the second extending parts 124 includes an FFC that extends from the main cable 110, while having at least one copper wire of the main cable 110.

That is, the terminal parts 120 connected to the battery cells are made of the FFC having a thin thickness. Therefore, space utilization of the interconnection member 100 may be maximized within the battery module, and an assembling process for the battery module may be simplified through a structure that is easily fixed by means of insulating tape and the like.

The contact part 122 has a ring shape so as to be inserted and fastened to the voltage sensing terminal in a riveting manner. The riveting manner, for example, means a configuration in which a rivet of the voltage sensing terminal is fastened to the inside of a ring of the contact part 122 to achieve mechanical and electrical coupling.

The connecting part 130 is a terminal of the main cable 110, which is electrically and mechanically coupled to an FFC connector provided on a PCB 10, and is made of an FFC as in the main cable 110. The connecting part 130 extends from the main cable 110, while sharing all the copper wires of the main cable 110.

Figure 2:
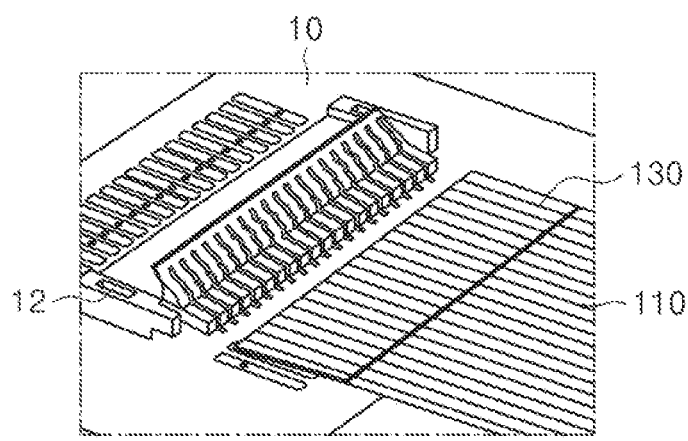
FIG. 2 is a schematic view of an exemplary connection between a connecting part and a PCB connector of a PCB.

In regard to this configuration, FIG. 2 illustrates a view of an exemplary connection between the connecting part and the FTC connector of the PCB 10.

The connecting part 130 may achieve the mechanical and electrical coupling between the interconnection member 100 and the PCB 10, with a convenient configuration in which the FFC having the thin thickness is inserted into a connector 12 of the PCB 10, when compared to a configuration in which the connecting part 130 is coupled on the PCB 10 by means of welding and the like.

The temperature sensing part 140 includes a first extending part 142 that extends from the main cable 110 while sharing at least one copper wire of the main cable 110, and a ceramic thermistor 144 provided on an end of the first extending part 142 while being electrically connected to the first extending part 142.

Figure 3:
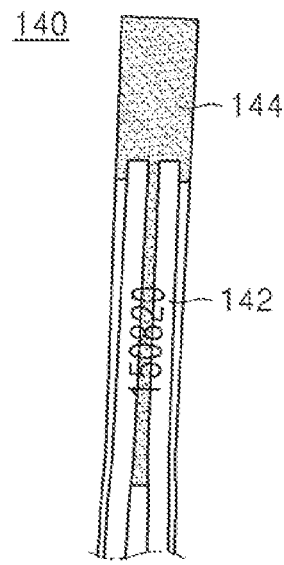
FIG. 3 is a schematic view of a temperature sensing part.

In regard to this configuration, FIG. 3 illustrates a schematic view of the temperature sensing part 140.

Referring to FIG. 3, the first extending part 142 is made of an FFC, and the ceramic thermistor 144 may be attached to an outer surface of the battery cell. Therefore, through this configuration, better space utilization of the interconnection member 100 may be achieved, and the number of components required for installation may be significantly reduced.

The temperature sensing part 140 may sense a temperature by detecting a change in current that flows from the ceramic thermistor 144 to the PCB 10 via the extending part and connecting part 130.

Figure 4:
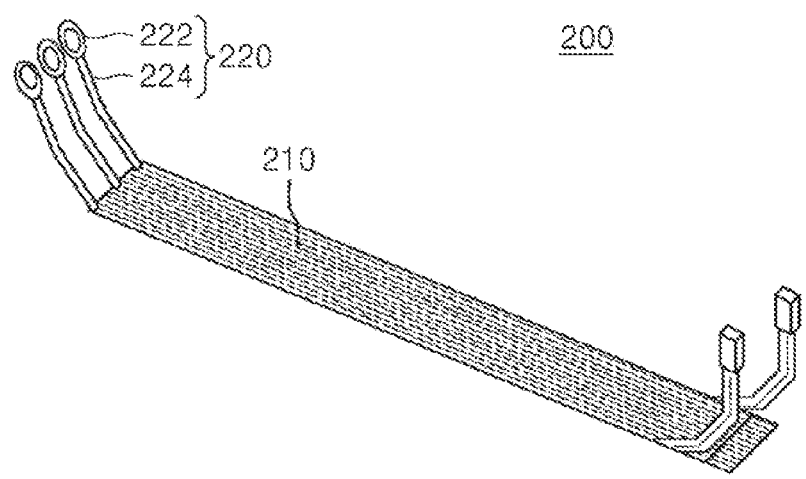
FIG. 4 is a schematic view of an interconnection member in accordance with another exemplary embodiment.

FIG. 4 illustrates an interconnection member in accordance with another exemplary embodiment.

Figure 5:
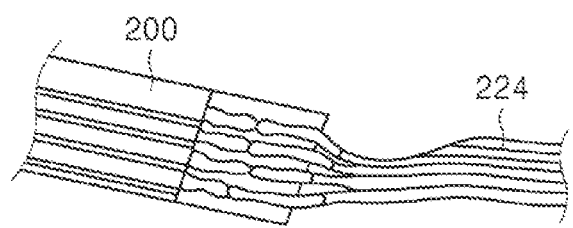
FIG. 5 is a schematic view showing a bonded shape of a main cable and second extending parts.

Referring to FIG. 4, an interconnection member 200 is similar to the interconnection member 100 of FIG. 1, except for a structure of a terminal part 220. Hereinafter, the structure of the terminal part 200 will be described in conjunction with FIG. 5 illustrating an image in which a main cable 210 is bonded to second extending parts 224.

Each of the terminal parts 200 includes a second extending part 224 that extends from the main cable 210, and a contact part 222 that is electrically connected to the second extending part 224 and contacts a voltage sensing terminal disposed a bus bar. The second extending parts 224 include wires respectively coupled to copper wires of the main cable 210 by means of soldering.

Such a structure may be connected to the main cable 210, with a longer length, because a wire itself has high durability. Particularly, this may be preferable in case that the main cable 210 is remote far from the battery cells due to a large size of the battery module.

Figure 6:
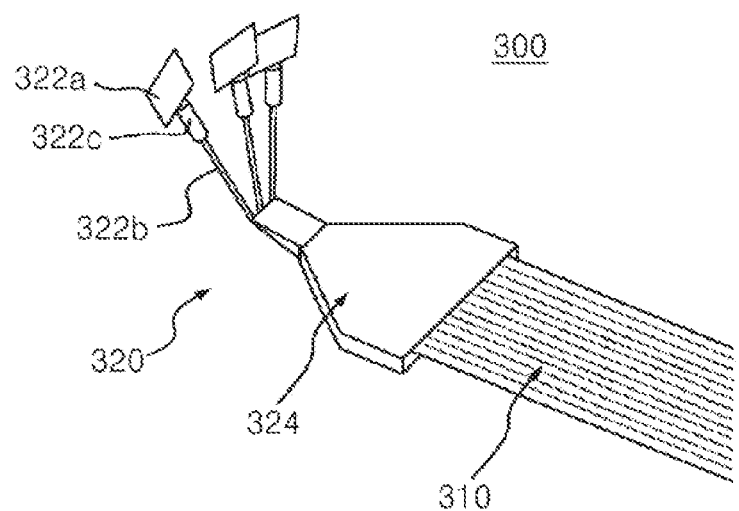
FIG. 6 is a schematic view showing a portion of an interconnection member in accordance with another exemplary embodiment.

Referring to FIG. 6, an interconnection member is similar to the interconnection member of FIG. 1 or FIG. 4, except for a structure of a terminal part. That is, the structure of the terminal part is different from the foregoing structures.

In particular, the terminal part 320 of the interconnection member includes a second extending part that extends from a main cable 310, and a contact part 330 that is electrically connected to the second extending part and contacts a voltage sensing terminal provided in the bus bar.

In this case, a first clamping part 324 is coupled to the main cable 310 in a clamping manner, as a configuration in which the second extending part is electrically connected to the copper wires of the main cable 310.

The contact part 330 includes branched wires 332b branched from an end of the first clamping part 324, a second clamping part 332c coupled to the branched wires 332b in a clamping manner, and a plate-shaped plate contacting end 332a which extends from the second clamping part 332c and through which the contact part 330 is coupled to the voltage sensing terminal by means of soldering or laser welding.

Figure 7:
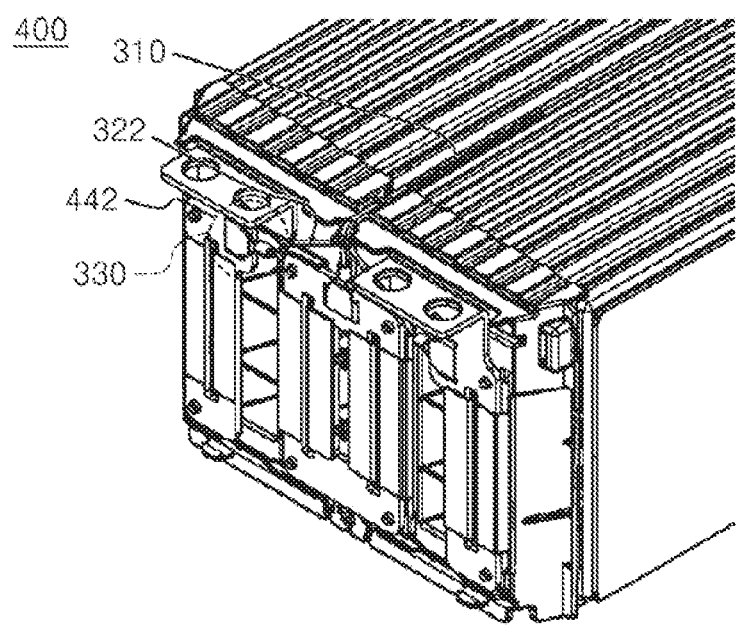
FIG. 7 is a schematic view showing a portion of a battery module in accordance with an exemplary embodiment including the interconnection member of FIG. 6.

In regard to this structure, FIG. 7 illustrates a schematic view showing a portion of a battery module in accordance with an exemplary embodiment, including the interconnection member of FIG. 6.

Referring to FIG. 7 in conjunction with FIG. 6, the main cable 310 of the interconnection member is fixed to a module laminated body in such a manner that the main cable 310 is attached to an insulating film along the module laminated body, and the first clamping part 324 of the terminal part 320 is coupled to an end of the main cable 310.

In the terminal part 320, the branched wires 332b are branched from the first clamping part 324, and the contact part 330 including the plate-shaped plate contacting end 332a, which extends from the second clamping part 332c, includes the second clamping part 332c in a clamping manner, and thus the second clamping part 332c is coupled to the branched wires 332b.

Each of the contact ends 332a of the contact part 330 is coupled to a voltage sensing terminal 442 of a bus bar assembly, and this coupling may be achieved by means of, for example, soldering, ultrasonic welding, laser welding, resistance welding, and the like.

Figure 8:
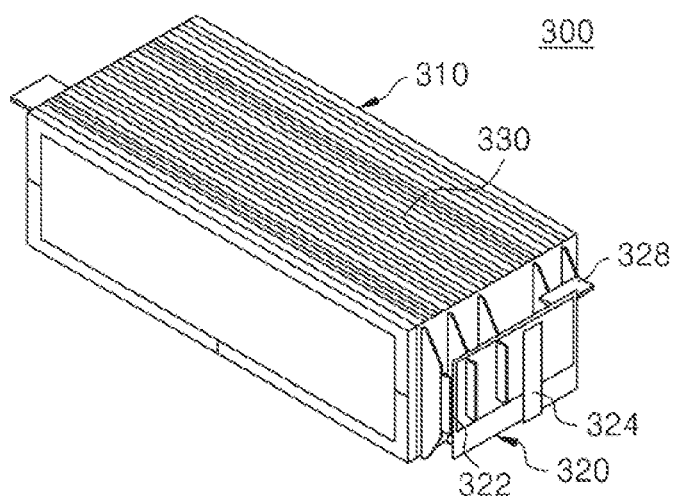
FIG. 8 is a schematic view of a battery module in accordance with another exemplary embodiment.

Also, FIG. 8 illustrates a schematic view showing a battery module in accordance with an exemplary embodiment.

Referring to FIG. 8, a battery module 300 includes an interconnection member 330, a module laminated body 310 in which battery cells are laterally arranged, and a bus bar assembly 320 that electrically connects electrode terminals, which are disposed on the front and rear surface of the module laminated body 310, of the battery cells.

The bus bar assembly 320 includes bus bars 322 respectively coupled to the electrode terminals of the battery cells, and a main frame 326 on which the bus bars 322 are fixed and a PCB 324 is mounted.

In this case, the interconnection member 330 is fixed to the module laminated body 310 in such a manner that a main cable is attached by an insulating film along an outer surface of the module laminated body 310, and a connecting part disposed on one-side end of the interconnection member 330 comes into contact with the PCB 324.

That is, the main cable of the present disclosure is made of the FFC that is extremely thin and lightweight, and thus there is no need to prepare a separate space and a plurality of fastening members such as screws, bolts, rivets, and coupling arms, for installing the interconnection member. Therefore, a battery module with a more compact structure may be provided.

It will be apparent, by those skilled in the art to which the present disclosure pertains, that various applications and modifications can be made thereto, on the basis of the above-descriptions, within the scope of the present disclosure.

The invention claimed is:

1. An interconnection member for connecting bus bars which are coupled to a printed circuit board (PCB) of a battery module and electrode terminals of battery cells, the interconnection member comprising:
（a) a main cable made of a flexible flat cable (FFC) including a plurality of copper wires;
(b) a plurality of terminal parts branched from the main cable and electrically connected to at least one of the plurality of copper wires of the main cable, the plurality of terminal parts being connected to the bus bars to sense voltages of the battery cells;
(c) a connecting part formed on one-side end of the main cable, and electrically and mechanically connected to the PCB; and
(d) at least one temperature sensing part branched from the main cable, adjacent to the connecting part, while sharing at least one of the plurality of copper wires of the main cable;
wherein at least two of (b) to (d) are made of an FFC,
wherein the at least one temperature sensing part comprises:
a first extending part extending from the main cable while sharing at least one copper wire of the plurality of copper wires of the main cable; and
a ceramic thermistor disposed on an end of the first extending part while being electrically connected to the first extending part,
wherein the plurality of terminal parts and the at least one temperature sensing part branched from the main able are short-circuited to each other so that the plurality of copper wires of the main cable, which are respectively shared by the plurality of terminal parts and the at least one temperature sensing, are short-circuited to each other,
wherein each of the plurality of terminal parts comprises:
a second extending part that extends from two sides of the main cable, respectively while being spaced from each other at a predetermined distance so as to result in a symmetrical configuration based on the main cable; and
a contact part that is electrically connected to the second extending part and contacts a voltage sensing terminal provided in the bus bars, and
wherein the second extending part is an FFC that extends from the main cable while sharing at least one copper wire of the plurality of copper wires of the main cable.

2. The interconnection member of claim 1, wherein the connecting part is made of an FFC so as to be electrically and mechanically coupled to an FFC connector provided in the PCB.

3. The interconnection member of claim 1, wherein the first extending part is made of an FFC, and the ceramic thermistor is attached to an outer surface of a battery cell of the plurality of battery cells.

4. The interconnection member of claim 3, wherein a temperature is sensed by detecting a change in current that flows from the ceramic thermistor to the PCB via the first extending part and the connecting part.

5. The interconnection member of claim 1, wherein the connecting part extends from the main cable while sharing all of the plurality of copper wires of the main cable.

6. The interconnection member of claim 1, wherein the second extending part is a wire coupled to at least one copper wire of the plurality of copper wires of the main cable by means of soldering.

7. The interconnection member of claim 1, wherein the contact part has a ring shape so that the contact part is inserted and fastened to the voltage sensing terminal in a riveting manner.

8. The interconnection member of claim 1, wherein the contact part is made of a plate-shaped plate so that the contact part is inserted and fastened to the voltage sensing terminal in a clamping manner.

9. The interconnection member of claim 1, wherein, through the clamping manner, a plurality of voltage sensing terminals are pressed and deformed, in a state in which the contact part is disposed between the plurality of voltage sending terminals, to be mechanically fastened to the contact part.

10. The interconnection member of claim 1, wherein the contact part is made of a ring- or plate-shaped metal plate so that the contact part is coupled to the voltage sensing terminal by means of soldering or laser welding.

11. The interconnection member of claim 1, wherein a first clamping part is coupled to the main cable in a clamping manner, as a configuration in which the second extending part is electrically connected to the plurality of copper wires of the main cable, and
    wherein the contact part comprises:
    branched wires which are branched from an end of the first clamping part;
    a second clamping part coupled to the branched wires in a clamping manner; and
    a plate-shaped plate contacting end which extends from the second clamping part and through which the contact part is coupled to the voltage sensing terminal by means of soldering or laser welding.

12. A battery module comprising:
    the interconnection member of claim 1;
    a module laminated body in which at least two battery cells are laterally arranged; and
    a bus bar assembly that electrically connects electrode terminals of battery cells disposed on at least one of a front surface and a rear surface of the module laminated body.

13. The battery module of claim 12, wherein the bus bar assembly comprises:
    the bus bars respectively coupled to the electrode terminals of the battery cells; and
    a main frame on which the bus bars are fixed and the PCB is mounted.

14. The battery module of claim 12, wherein the interconnection member is fixed to the module laminated body in such a manner that the main cable is attached, along an outer surface of the module laminated body, by means of an insulating film or an adhesive.

15. A device comprising the battery module of claim 12.

* * * * *